United States Patent
Liu et al.

(10) Patent No.: US 7,786,810 B2
(45) Date of Patent: Aug. 31, 2010

(54) PHASE LOCKED LOOP WITH LEAKAGE CURRENT CALIBRATION

(75) Inventors: Shen-Iuan Liu, Taipei (TW); Jung-Yu Chang, Taipei (TW); Chao-Ching Hung, Taipei County (TW)

(73) Assignee: National Taiwan University, Taipei (TW)

( * ) Notice: Subject to any disclaimer, the term of this patent is extended or adjusted under 35 U.S.C. 154(b) by 43 days.

(21) Appl. No.: 12/323,081

(22) Filed: Nov. 25, 2008

(65) Prior Publication Data
US 2010/0001771 A1     Jan. 7, 2010

(30) Foreign Application Priority Data
Jul. 1, 2008   (TW) ............................. 97124800 A

(51) Int. Cl.
*H03L 7/08*    (2006.01)
*H03L 7/085*   (2006.01)
*H03L 7/093*   (2006.01)

(52) U.S. Cl. ............................. 331/17; 331/8; 331/25; 331/179

(58) Field of Classification Search ................. 331/1 A, 331/8, 16–18, 25, 175, 179; 327/156–159
See application file for complete search history.

(56) References Cited

U.S. PATENT DOCUMENTS
6,570,423 B1 *   5/2003   Trivedi et al. ............... 327/157

* cited by examiner

*Primary Examiner*—David Mis
(74) *Attorney, Agent, or Firm*—Volpe and Koenig PC

(57) ABSTRACT

A phase locked loop with a current leakage adjustment function is provided. The phase locked loop includes a phase locked loop unit having a compensation voltage node, a digitalized leakage-detection circuit generating a plurality of digital control signals based upon the phase error between a reference clock signal and a feedback signal, and a compensation circuit generating a compensation current based upon the plurality of digital control signals. When there exist current leakages of the MOS capacitors, the current leakage adjustment circuits provided by the present invention may prevent the conventional phase locked loop from un-locking due to jittering.

19 Claims, 7 Drawing Sheets

PHASE LOCKED LOOP WITH LEAKAGE CURRENT CALIBRATION

FIELD OF THE INVENTION

The present invention relates to a phase locked loop, and more particularly to a phase locked loop with a current leakage adjustment function.

BACKGROUND OF THE INVENTION

In a high-speed microprocessor and communication systems, a phase locked loop (PLL) is the portion that cannot do without. With the development of the semiconductor industry, operation frequencies of microprocessors have been higher and higher. A PLL is designed in a microprocessor as the system synchronizer as well as the frequency integrator, to eliminate any inconsistence in terms of timing between the external reference clock and internal clock, and to support the need of an internal high frequency clock. The PLL is much needed for system synchronizing, clock or data recovering, and frequency integration, in a communication system. PLL is important in a vast number of applications for system design. Therefore, the PLL has importance in the broad applications of communication systems.

According to a digital PLL broadly used by the industry, FIG. 1 shows the basic circuit structure of the PLL. To a skilled person of this art, the digital PLL 1 is composed of a digital circuit including a phase-frequency detector (PFD) 10, an analogue charge pump 11, a loop filter 12, a voltage controlled oscillator (VCO) 13, and a frequency divider 14. The PFD 10 makes comparison between a feedback signal Fi' (in which the Fi' results from a clock signal gone through the frequency divider 14 for frequency dividing) and an external reference signal Fr, and based upon the frequencies and the phase error of the two signals outputs a series of digital increment control signals and decrement control signals to charge/discharge the charge pump 11. The charge pump 11 receives the increment signals and decrement signals from the PFD 10 and converts the input into a control current output. The loop filter 12 receives the control current, filters a high-frequency signal made by the charge pump 11, and generates a control voltage. The combination of the charge pump 11 and the loop filter 12 may convert those digital increment signals and decrement signals from the PFD 10 into an analogue input signal that is acceptable for the VCO 13, to adjust the output frequency as well as phase of the VCO 13. The VCO 13 is an oscillation circuit, based upon the magnitude of the control voltage made by the loop filter for generating a corresponding oscillation frequency.

According to the above, the loop filter 12 in the digital PLL 1 often adopts MIM capacitors capable of differentiating a plurality of high-frequency signals and low-frequency ones.

Unfortunately, referring to FIG. 2 which shows a schematic diagram of a typical MIN capacitor, the thickness d of the dielectric layer in the MIN capacitor 2 between a first metal layer 20 and a second metal layer 22 has to be reduced as the dimensions of MOS components keep being reduced. But such a reduction would end up with reduced capacitor values per unit area and increased capacitor/voltage coefficients Aiming to the drawbacks of the traditional MIM capacitors, the metal-oxide semiconductor field-effect transistor (MOSFET) has been suggested as a replacement. FIG. 3 shows a simple structure of a MOSFET.

For a digital PLL, a low thickness of the gate oxidation layer in a MOSFET capacitor may result in current leakage if the MOSFET capacitor is adopted in the filter. Such an effect may further result in a phenomenon of phase inconsistence of time clock. It would be a serious threat to the accuracy of the operation of a communication system and consequently make a phase locking process between an output signal from the digital PLL and the reference signal incomplete.

Therefore, according to the issue set forth in previous paragraphs, it is urgently needed to provide a digital PLL capable of compensating the current leakage in the gate oxide layer of the MOS capacitor in the filter, to avoid the incompleteness of the phase locking process.

Besides, the current leakage due to the low thickness of the gate oxide layer would cause jittering that results in poor performance of a PLL, when the MOS capacitor is used for a filter component in the filter circuit.

SUMMARY OF THE INVENTION

In accordance with the above-mentioned purpose, the present invention provides a phase locked loop (PLL) with a current leakage adjustment function. The phase locked loop comprises a phase locked loop unit and a self-adjusting circuit. The phase locked loop unit has a filter and generates a control voltage based upon a frequency error and a phase error between a reference clock signal and a feedback signal, wherein the filter has a compensation voltage node and a first leakage current having a first value. The self-adjusting circuit includes a MOS capacitor, a current mirror, and a voltage adjusting circuit. The MOS capacitor generates a second leakage current having a second value being one $M^{th}$ of the first value of the first leakage current based upon the first leakage current, wherein M is a natural number. The current mirror generates a compensation current having a magnitude near M times of the first value of the first leakage current based upon the second leakage current, inputs the compensation current into the compensation voltage node of the filter, and receives the second leakage current to generate a reference voltage. The voltage adjusting circuit performs a variety of band switchings when a voltage value at the compensation voltage node is not equal to that of the reference voltage in the current mirror.

According to a preferred embodiment of the present invention, the phase locked loop unit generates a high frequency clock signal based upon a variation of the control voltage.

Preferably, the voltage adjusting circuit comprises a comparator and a successive approximation register.

Preferably, the current mirror comprises a first NMOS transistor, a second NMOS transistor and a conducting line.

Preferably, a size of the second NMOS transistor is M times of that of the first NMOS transistor.

Preferably, the conducting line is connected to a gate and a source of the first NMOS transistor and a gate of the second NMOS transistor respectively.

Preferably, the reference voltage occurs when the second leakage current flows into the first NMOS transistor via the conducting line.

In accordance with another aspect of the present invention, a phase locked loop with a current leakage adjustment function is provided. The phase locked loop comprises a phase locked loop unit, a MOS capacitor, a second compensation circuit, and a code selector. The phase locked loop unit has a first compensation circuit and a filter, and generates a control voltage based upon a frequency error and a phase error between a reference clock signal and a feedback signal. The first compensation circuit provides a first compensation current having a first value, and the filter has a compensation voltage node and a first leakage current having a second value. The MOS capacitor generates a second leakage current having a third value being one $M^{th}$ of the second value of the first leakage current based upon the first leakage current, in which M is a natural number. The second compensation circuit is connected to the compensation voltage node via a switch and generates a second compensation current having a fourth value being one $M^{th}$ of the first value of the first compensation current. The code selector respectively receives a first voltage at a point between the MOS capacitor and the second compensation circuit and a second voltage from the compensation voltage node of the filter, and inputs a set of best codes to the first and the second compensation circuits.

Preferably, the switch is a MOS transistor switch, and the phase locked loop unit generates a high frequency clock signal based upon a variation of the control voltage.

Preferably, the code selector comprises a comparator and a successive approximation register. The comparator receives the first voltage and the second voltage, compares the first voltage with the second voltage, and outputs a digital control signal. The successive approximation register identifies the set of best codes based upon a number of a plurality of bits of the digital control signal, and transmits the set of best codes to the first and the second compensation circuits.

Preferably, both the first and the second compensation circuits comprise a plurality of NMOS capacitors and a plurality of switches correspondingly connected to the plurality of NMOS capacitors.

Preferably, a size of the NMOS capacitors in the second compensation circuit is one $M^{th}$ of that of the NMOS capacitors in the first compensation circuit. Preferably, the phase locked loop unit further comprises a phase-frequency detector, a charge pump, a voltage-controlled oscillator, and a first frequency divider. The phase-frequency detector receives the reference clock signal and the feedback signal for comparison, and generates a series of increment control signals and a series of decrement control signals based upon the frequency error as well as the phase error between the reference clock signal and the feedback signal. The charge pump receives the increment control signals and the decrement control signals from the phase-frequency detector for charging/discharging to generate a control current. The voltage-controlled oscillator generating a high frequency clock signal based upon a variation of the control voltage from the filter. The first frequency divider receives the high frequency clock signal from the voltage-controlled oscillator and performs a frequency division for generating the feedback signal.

In accordance with another aspect of the present invention, a phase locked loop is provided. The phase locked loop comprises a phase locked loop unit, a digitalized leakage-detection circuit, and a compensation circuit. The phase locked loop unit has a compensation voltage node, and generates a control voltage based upon a phase error between a reference clock signal and a feedback signal. The digitalized leakage-detection circuit generates a plurality of digital control signals based upon the phase error between the reference clock signal and the feedback signal. The compensation circuit generates a compensation current based upon the plurality of digital control signals.

According to a preferred embodiment of the present invention, the phase locked loop further comprises a phase-frequency detector, a charge plump, a filter, a voltage-controlled oscillator, and a frequency divider. The phase-frequency detector receives the reference clock signal and the feedback signal, and generates a series of increment control signals and a series of decrement control signals based upon a frequency error and the phase error between the reference clock signal and the feedback signal. The charge pump receives the increment control signals and the decrement control signals from the phase-frequency detector for charging/discharging to generate a control current. The filter has the compensation voltage node, receives the control current from the charge pump, filters high frequency signals of the increment control signals and the decrement control signals, and generates the control voltage. The voltage-controlled oscillator generates a high frequency clock signal based upon a variation of the control voltage from the filter. The frequency divider receives the high frequency clock signal from the voltage-controlled oscillator and performs a frequency division for generating the feedback signal.

Preferably, the filter comprises a resister, a MIN capacitor, and a MOS capacitor.

Preferably, the MOS capacitor has a leakage current charging the filter so as to change a value of the control voltage.

Preferably, the compensation circuit generates the compensation current based upon codes of the digital control signals from the digitalized leakage detection circuit, and the compensation current is inputted into the compensation voltage node of the filter.

Preferably, the digitalized leakage-detection circuit comprises a lock detector, a logic controller, a frequency divider and a counter.

Preferably, the compensation circuit comprises a plurality of first switches, each of which includes a pair of first NMOS capacitors, and a plurality of second switches, each of which includes a current source connected to a second NMOS capacitor. All the first switches are connected to one another, and all the second switches are connected to one another.

The above objects and advantages of the present invention will become more readily apparent to those ordinarily skilled in the art after reviewing the following detailed descriptions and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for the purposes of illustration and description only; it is not intended to be exhaustive or to be limited to the precise form disclosed.

Figure 1:
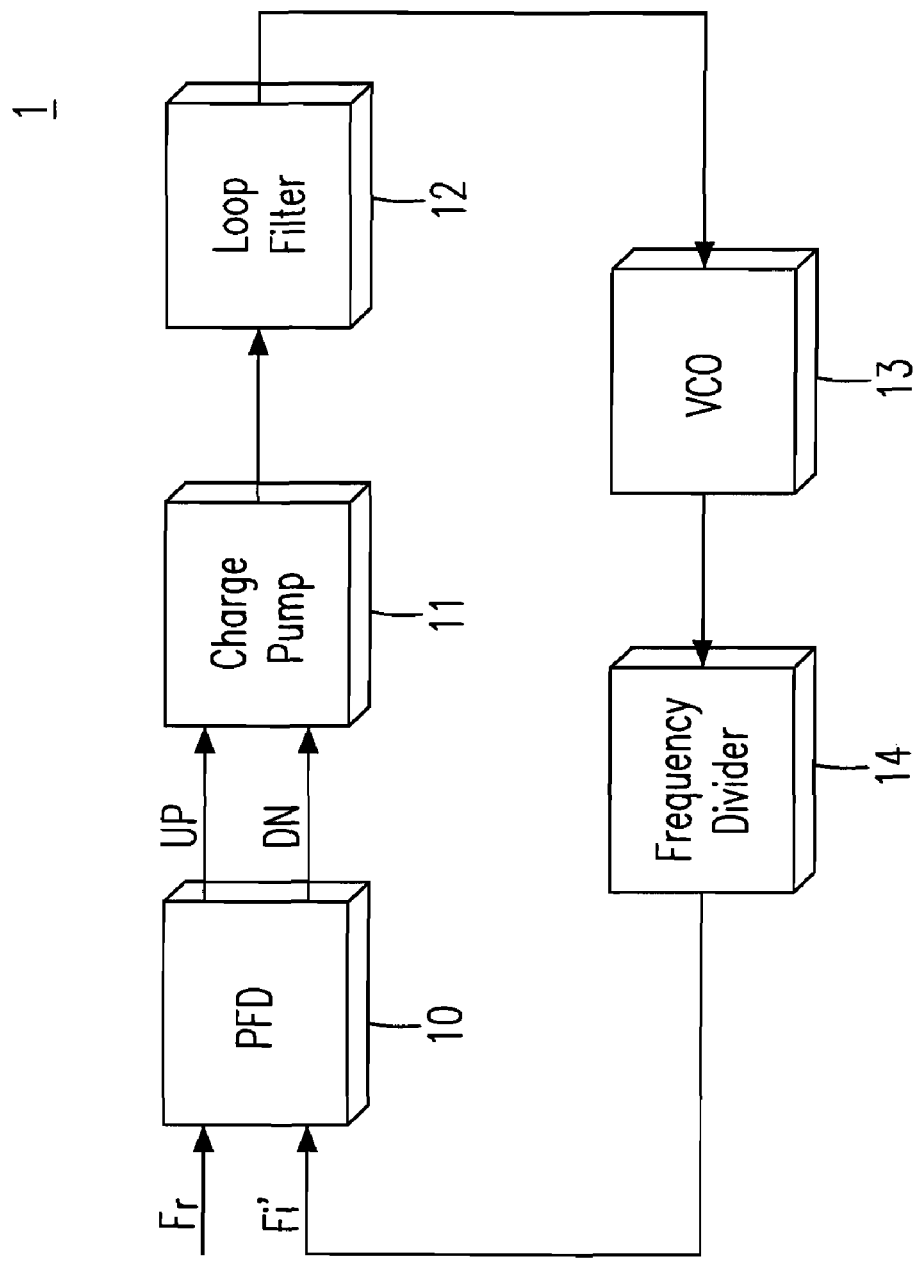
FIG. 1 is a schematic diagram showing a basic circuit structure of a phase locked loop.
Figure 2:
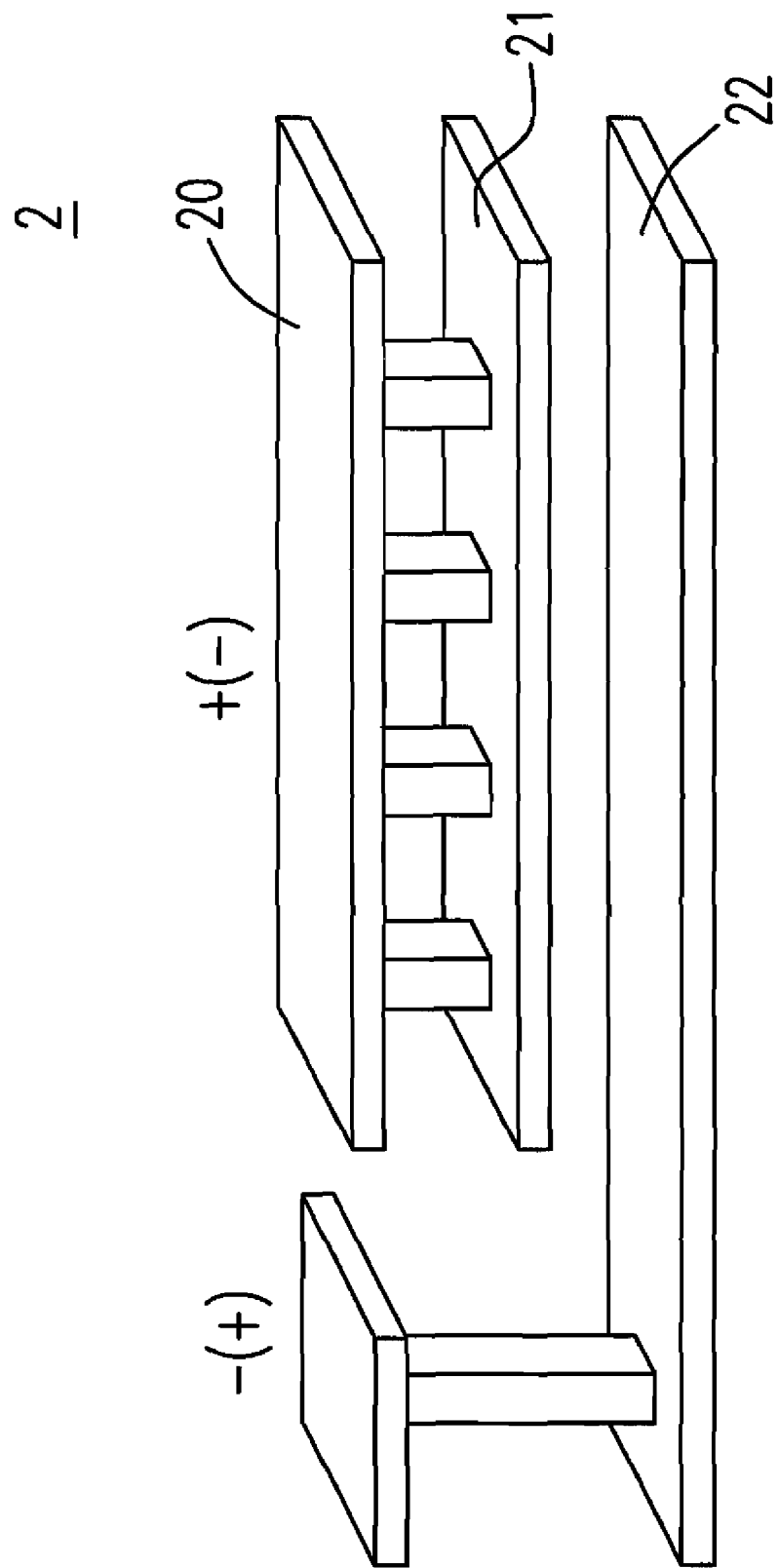
FIG. 2 is a schematic diagram of a typical MIN capacitor.
Figure 3:
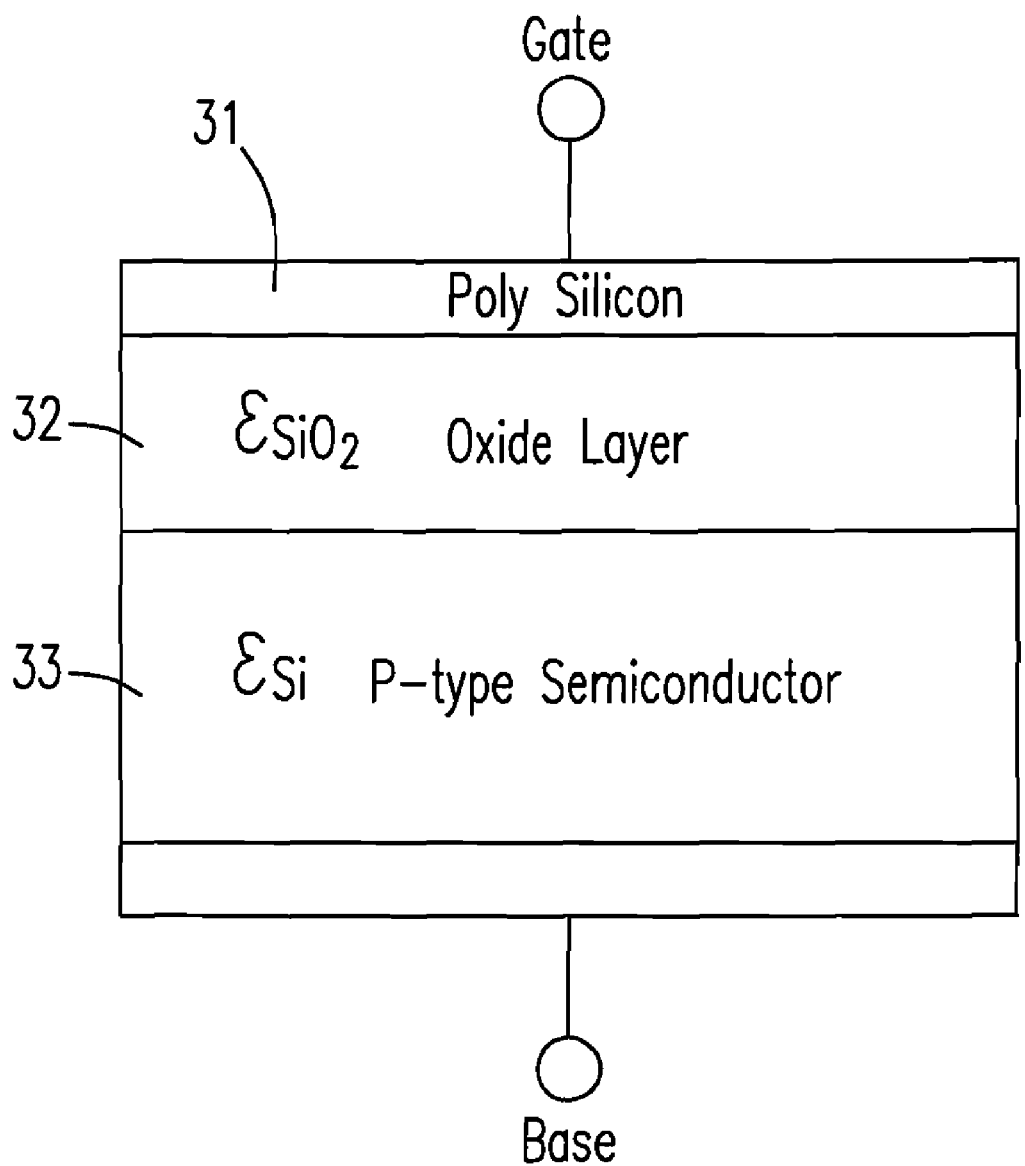
FIG. 3 is a schematic diagram showing a structure of a MOSFET.
Figure 4:
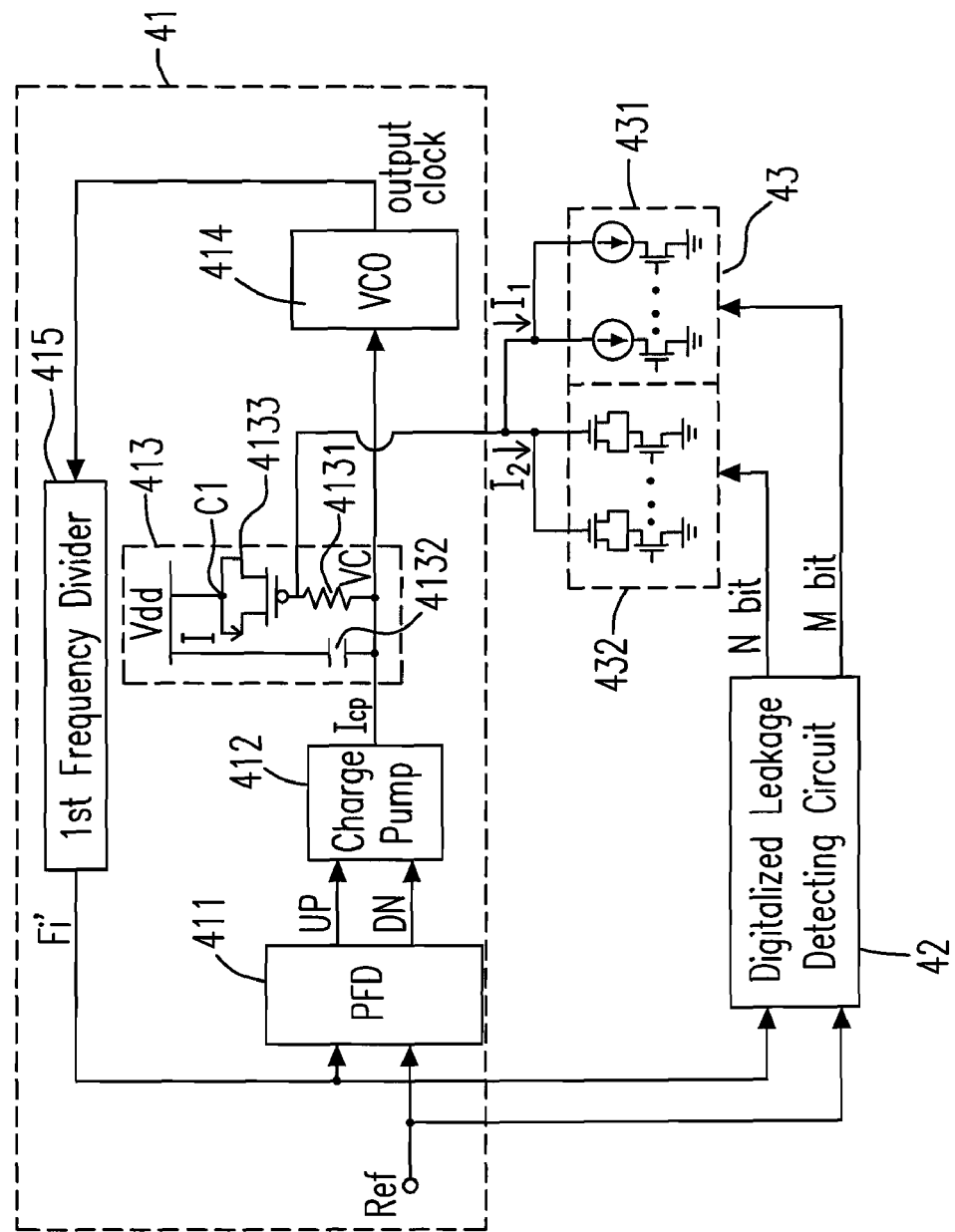
FIG. 4 is a circuit diagram of a digital phase locked loop (PLL) with a current leakage adjustment function, according to the present invention.

Please refer to FIG. 4, which is a circuit diagram of a digital phase locked loop (PLL) with a current leakage adjustment function, according to the present invention. Such a digital PLL may be integrated in a local oscillator of an FM broadcast receiver.

According to FIG. 4, the digital PLL 4 includes a PLL unit 41 having a compensation voltage node C1, a digitalized leakage detection circuit 42, and a compensation circuit 43. Particularly, the PLL unit 41 includes a phase-frequency detector (PFD) 411, a charge pump 412, a filter 413, a voltage controlled oscillator (VCO), and a first frequency divider 415.

More specifically, the first frequency divider 415 (adopting a natural number n as a divisor) performs frequency dividing for an input signal (whose period is $T_{ref}$, in which, $T_{ref}$ is larger than 0) so as to output a feedback signal Fi', and transmits a reference time clock signal Ref and the feedback signal Fi' to the PFD 411. The PFD 411 compares both a frequency error and a phase error of the two signals and generates a series of increment control signals and decrement control signals. It is to be understood that the signal width of the increment signals and decrement signals generated by the PFD 411 is also named a reset time $T_{rst}$ when the PLL unit is under a locked status.

The charge pump 412 performs charge/discharge and generates a control current $I_{cp}$ based upon a status of the increment control signals and the decrement control signals from the PFD 411, in which the charge pump generates a charging current $I_{up}$ (not shown) when the increment control signals are 0 and generates a discharging current $I_{dn}$ (not shown) when the decrement control signals are 1. And the value of the $I_{cp}$ equals a sum of that of the $I_{up}$ and the $I_{dn}$. The control current $I_{cp}$ is transmitted to the filter 413, composed of a resistance 4131, a MIM capacitor 4132, and a MOS capacitor 4133. It is to be mentioned that those capacitors adopted in the charge pump 412 are usually used as energy storage components, capable of filtering high frequency signals of the increment control signals and decrement control signals to generate a control voltage. Inevitably, a leaking current I may exist in the MOS capacitor 4133 due to its thin gate oxide layer and flow out of the filter 413 (downward).

Therefore, the digitalized leakage detection circuit 42 and the compensation circuit 43 of the present invention are for resolving such an issue of current leaking. More detailed descriptions are set forth below.

At the time when the PFD 411 is receiving the feedback signal Fi' and the reference clock signal Ref, the two signals are transmitted to the digitalized leakage detection circuit 42. The digitalized leakage detection circuit 42 generates a plurality of digital control signals based upon the two inputted signals. To be more specific, FIG. 5 shows a detailed circuit diagram of the digitalized leakage detection circuit 42.

Figure 5:
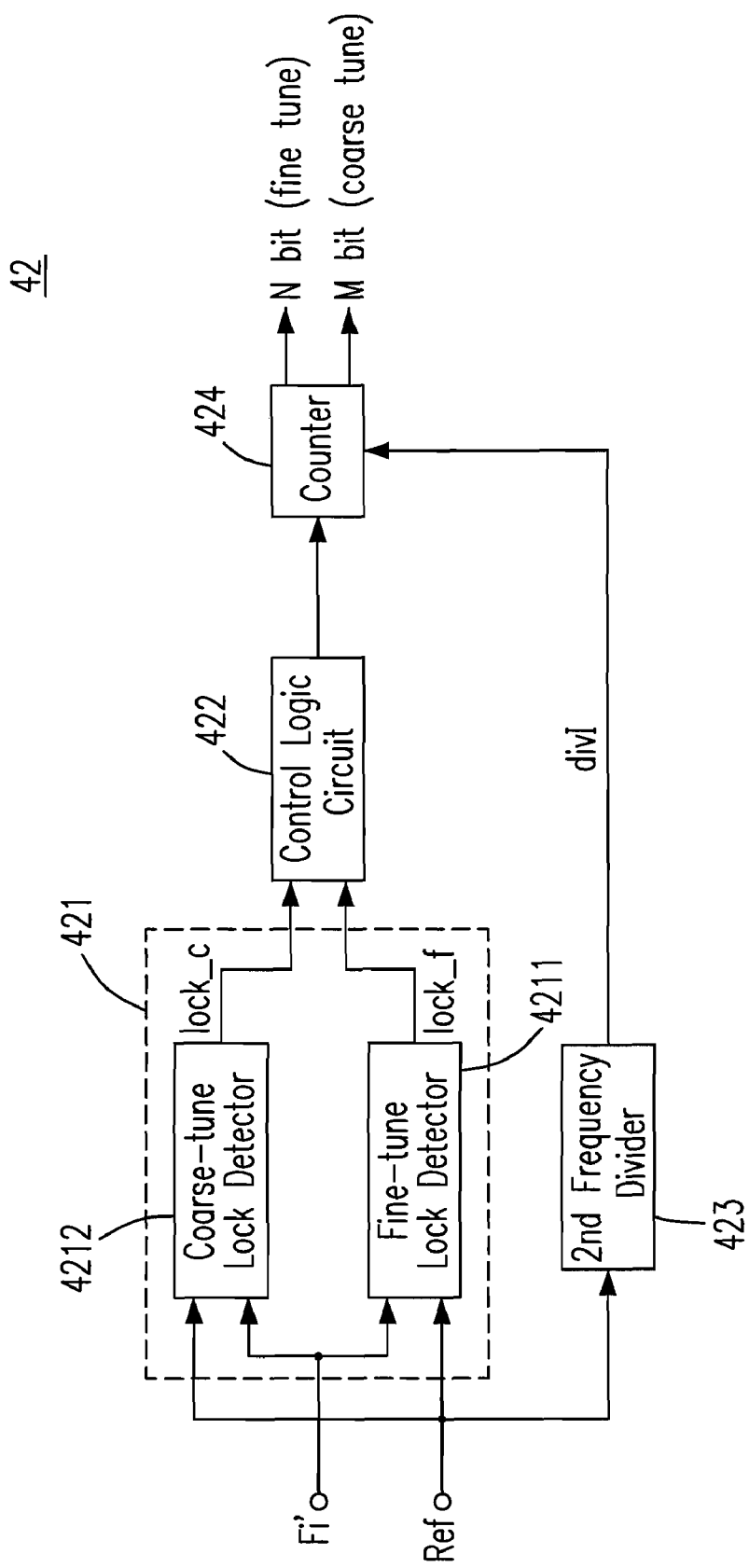
FIG. 5 is a schematic diagram showing a preferred embodiment of the digital leakage detecting circuit.

Obviously, as shown in FIG. 5, the digitalized leakage detection circuit 42 comprises a lock detector 421 composed of a fine-tune lock detector 4211 (which is composed of a variety of digital logic circuits, such as several flip-flops and logic calculation units) and a coarse-tune lock detector 4212 (which is composed of a variety of digital logic circuits, such as several flip-flops, logic calculation units, and delay units), a control logic circuit 422, a second frequency divider 423, and a counter 424.

The feedback signal Fi' and the reference clock signal Ref are inputted to the fine-tune lock detector 4211 and the coarse-tune lock detector 4212, to generate a fine-tune lock signal lock_f and a coarse-tune lock signal lock_c, respectively. In one example, when the phase error between the feedback signal Fi' and the reference clock signal Ref is larger than a first window, the status of the fine-tune lock signal lock_f and the coarse-tune lock signal lock_c are 0; when the phase error is smaller than the first window, the status of the fine-tune lock signal lock_f is 0 and the coarse-tune lock signal lock_c is 1; and when the phase error is smaller than a second window, the fine-tune lock signal lock_f and the coarse-tune lock signal lock_c are 1.

Till now, the control logic circuit 422 in the digitalized leakage detection circuit 42 based upon the values of fine-tune lock signal lock_f and the coarse-tune lock signal lock_c performs logic calculations to generate a counter control signal control. Particularly, when the status of lock_c is 0 and that of lock_f is 0, the status of the counter control signal control is 00 (double digits); when the status of lock_c is 1 and that of lock_f is 0, the status of control is 01; and when the statuses of lock_c and lock_f are both 1, the status of control is 10. The second frequency divider 423 (having a divisor n') performs frequency dividing for the reference clock signal Ref, to generate a low frequency signal div1. The counter control signal control from the control logic circuit 422 and the low frequency signal div1 from the second frequency divider 423 are transmitted to the counter 424.

When the status of the counter control signal control is 00, the counter 424 is triggered based upon the positive edge of each period of the low frequency signal div1 and starts a countdown. In addition, the counter 424 generates a coarse-tune current control signal (M bit) based upon the status (00) of the counter control signal control. When the status of control is 01, the counter 424 is triggered based upon the positive edge of each period of the low frequency signal div1 and starts counting, and generates a fine tune control signal (N bit) based upon the status (01) of control. When the status of control is 10, the counter 424 stops counting and transmits the coarse tune current control signal and the fine-tune current control signal to the compensation circuit 43 in FIG. 4.

According to FIG. 4, the compensation circuit 43 comprises a coarse-tune compensation circuit 431 and a fine-tune compensation circuit 432. The coarse-tune compensation circuit 431 comprises a plurality of current sources and a corresponding first group of switches, and the fine-tune compensation circuit 432 comprises a plurality of NMOS capacitors and a second group of switches correspondingly connected to the NMOS capacitors. To be specified, the coarse-tune current control signal from the digitalized leakage detection circuit 42 is transmitted to the coarse-tune compensation circuit 431, and the fine-tune current control signal from the digitalized leakage detection circuit 42 is transmitted to the fine-tune compensation circuit 432. The coarse-tune compensation circuit 431 controls the first group of switches based upon the code (say 9 digits) of the coarse-tune current control signal and then generates a corresponding coarse tune compensation current $I_1$ (in which $I_1$ flows downward). The fine-tune compensation circuit 432 controls the second group of switches based upon the code (say 9 digits) of the fine-tune current control signal and then generates a corresponding fine tune compensation current $I_2$ (in which $I_2$ flows downward).

Finally, $I_1$ and $I_2$ are transmitted to the filter having the compensation voltage node to compensate the leaking current I of the gate oxide layer of the MOS capacitor, which makes I equal to the sum of $I_1$ and $I_2$, or, $I=I_1+I_2$.

During the process when the compensation circuit 43 compensates at the compensation voltage node C1 in the filter 413, the control voltage generated by the filter 413 is transmitted to the VCO 414. And then the VCO 414 generates a high frequency clock signal, namely output clock, based upon the variation of the control voltage from the filter 413.

In addition, the value of the first window (Tw1) may be acquired based on the minimum current value ($I_{1,LSB}$) of the coarse-tune compensation current and both the charging current $I_{up}$ and discharging current $I_{dn}$ from the charging pump 412, as shown in equation 1.

$$I_{up}(T_{rst}+T_{w1})=I_{dn}T_{rst}+I_{1,LSB}T_{ref} \quad \text{equation 1}$$

The value of the second window ($T_{w2}$) may be acquired based on the minimum current value ($I_{2,LSB}$) of the coarse-tune compensation current and both the charging current $I_{up}$ and discharging current $I_{dn}$ from the charging pump 412, as shown in equation 2.

$$I_{up}(T_{rst}+T_{w2})=I_{dn}T_{rst}+I_{2,LSB}T_{ref} \qquad \text{equation 2}$$

Figure 6:
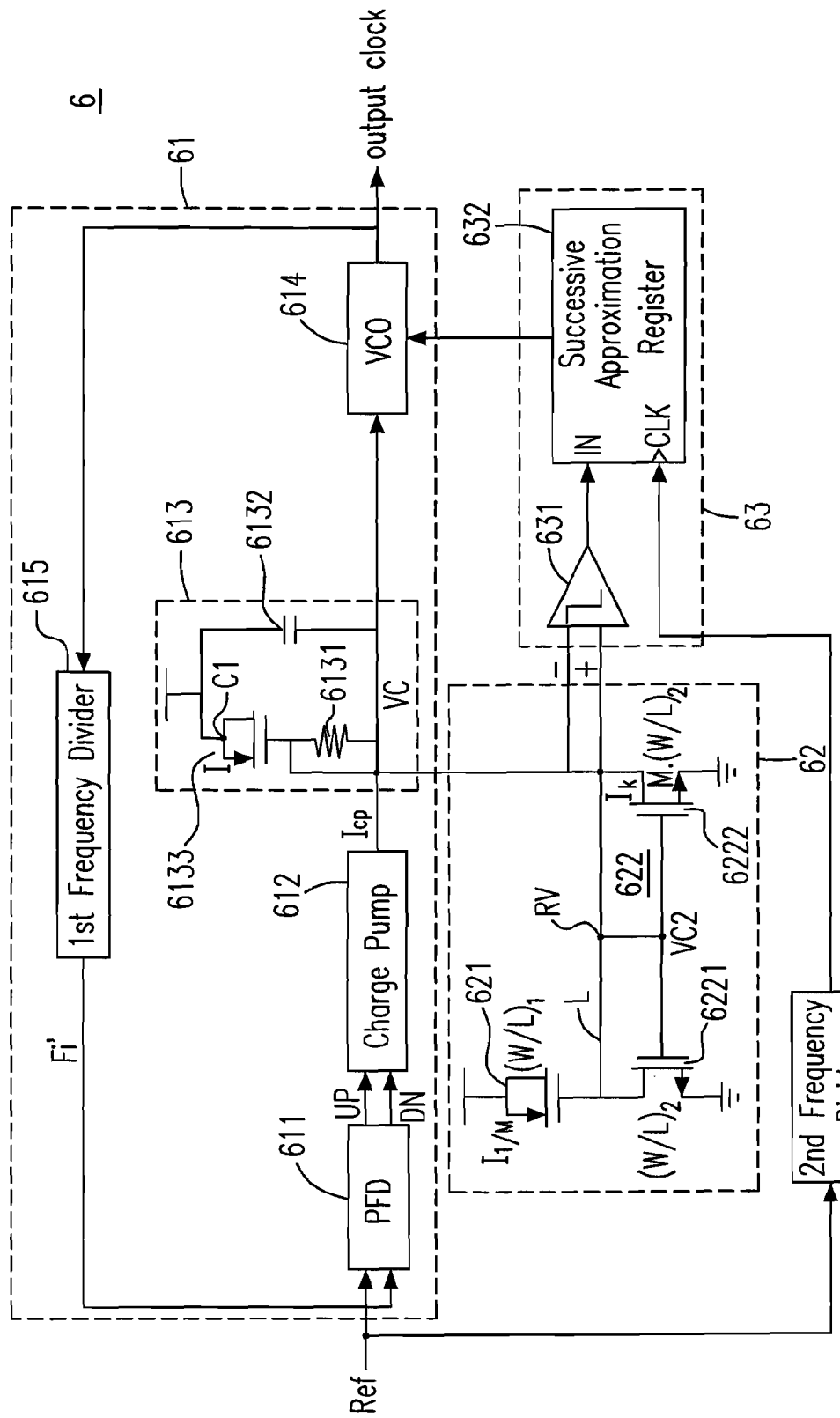
FIG. 6 is a circuit diagram showing another preferred embodiment of the present invention.

In addition to the abovementioned embodiment, the present invention also provides another embodiment of a PLL with a current leakage adjustment function. Please refer to FIG. 6, wherein the PLL 6 comprises a PLL unit 61 having a compensation voltage node C1, a self current-adjusting circuit 62 and a voltage adjusting circuit 63. Particularly, the PLL unit 61 comprises a phase frequency detector (PFD) 611, a charge pump 612, a filter 613 having the compensation voltage node C1, a voltage controlled oscillator 614, and a first frequency divider 615.

The first frequency divider 615 (having a divisor n which is a natural number) performs frequency dividing for an input signal, outputs the result as a feedback signal Fi', and transmits a reference clock signal Ref and the feedback signal Fi' to the PFD 611. The PFD 611 compares the frequency error and the phase error between the signals and generates a series of increment control signals UP and decrement control signals DN.

The charge pump 612 performs charge/discharge based upon the status of the increment control signals UP and the decrement control signals DN (in which a charge current is marked as $I_{up}$ and a discharge current is marked as $I_{dn}$; the charge pump generates the charge current $I_{up}$ when UP is 0, and generates the discharge current $I_{dn}$ when DN is 1) and generates a control current $I_{cp}$ ($I_{up}+I_{dn}=I_{cp}$). The control current is transmitted to the filter 613 composed of a resistor 6131, a MIM capacitor 6132, and a MOS capacitor 6133. Those capacitors in the charge pump 612 are usually used as energy storage elements and capable of filtering out high-frequency signals of the decrement control signals DN and the increment control signals UP to produce a control voltage. It is inevitable that a leaking current I may occur due to low thickness of the gate oxide layer of the MOS capacitor 6133. And the leaking current flows out from the filter 613 (I flows downward).

Confronting the issue of the existing current leakage in the MOS capacitor 6133, the present invention provides the self current-adjusting circuit 62 and the voltage adjusting circuit 63 to compensate the current leakage. More details are described thereinafter. According to FIG. 6, the self current-adjusting circuit 62 comprises a MOS capacitor 621, which is a one-$M^{th}$-time capacitor (the M is a natural number), and a current mirror 622.

The MOS capacitor 621 generates a one-$M^{th}$-time leaking current $I_{1/m}$ based upon a leaking current from the filter 613. The current mirror 622 comprises a first NMOS 6221, a second NMOS 6222, and a conducting line L. The conducting line L is connected to the gate and the source of the first NMOS 6221 and the gate of the second NMOS 6222. The size of NMOS 6222 is M times of that of the first NMOS 6221. Based upon the one-$M^{th}$-time leaking current $I_{1/M}$, the two NMOS generate a compensation current $I_K$ approximating M times of the value of I. The current mirror 622 transmits the compensation current $I_K$ to the compensation voltage node C1 and receives the leaking current $I_{1/M}$ that flows through the conducting line L, enters the first NMOS 6221, and produces a reference voltage RV. Meanwhile, the value of RV is different from that of a voltage at the compensation voltage node C1 for most of the time.

The voltage-adjusting circuit 63 provided by the present invention may resolve such a deficiency mentioned in prior paragraphs. According to FIG. 6, it is obvious that the voltage adjusting circuit 63 comprises a comparator 631 having two inputting nodes and a successive approximation register (SAR) 632. Compared with the other types of searching registers, the SAR needs less searching time and less hardware resource. A second frequency divider 616 (a natural number N' is used as divisor) performs frequency dividing for the reference clock signal Ref and transmits the result to a clock node CLK at the SAR.

The two inputting nodes of the comparator 631 receive the reference voltage RV from the conducting line L and the voltage from the compensation voltage node C1 respectively, to compare the values of the two input voltages. When the voltage at C1 is higher than that of the RV, the comparator 631 outputs one bit (represented by "0") to the SAR 632. When the voltage at C1 is lower than that of the RV, the comparator 631 outputs one bit (represented by "1") to the SAR 632. Continuously, the comparator 631 outputs seven bits in sequence to the SAR 632.

When the comparator 631 outputs the first bit (say 1) to the SAR 632, the SAR 632 progressively outputs a first seven-bit (1000000) signal to the VCO 614. The VCO 614 performs a first band switching based upon the first seven-bit data. The process of the band switching will result in a re-locking of the PLL unit 61. After the re-locking of the PLL unit 61, the control voltage will remain a stable variation for a long period of time. The voltage at the voltage compensation node C1 in the filter 613 will be approached to the value of the reference voltage RV. When the comparator 631 transmits a second bit (say 0) to the SAR 632, the SAR 632 progressively outputs a second seven-bit (0100000) signal and transmits the signal to the VCO 614. The VCO 614 performs a second band switching based upon the second seven-bit signal, which makes the voltage of C1 further approach to the value of RV. Likewise, until the comparator 631 transmits the seven-bit (say 0) to the SAR 632, the SAR 632 progressively outputs a seventh seven-bit (0100101) signal to the VCO 614. The VCO 614 performs a seventh band-switching base upon the seventh seven-bit signal. Eventually, the voltage at C1 is equal to the reference voltage RV.

For the voltage at C1 is eventually equal to the reference voltage RV, which makes the compensation current $I_K$ exactly the same as M times of $I_{1/M}$, the M times of $I_{1/M}$ is exactly the same as the leaking current I from the compensation voltage node C1 of the filter 613. At this moment, the leaking current I will not pass through the resistor 6131 in the filter 613, but rather flows into the second NMOS 6222.

During the process of current compensation, the control voltage VC generated by the filter 613 is transmitted to the VCO 614. The VCO 614 generates a high-frequency clock signal based upon the voltage variation of the control voltage VC from the filter 613.

In addition to the abovementioned embodiments, the present invention provides a further embodiment of a PLL with a current leakage adjustment function. Please refer to FIG. 7, wherein the PLL comprises a PLL unit 71 having a compensation voltage node C1. Particularly, the PLL unit 71 includes a phase frequency detector (PFD) 711, a charge pump 712, a filter 713 having the compensation voltage node, a voltage controlled oscillator (VCO) 714, and a first frequency divider 715.

The first frequency divider 715 (having a divisor n which is a natural number) performs frequency dividing for an input signal, outputs the result as a feedback signal Fi', and transmits a reference clock signal Ref and the feedback signal Fi' to the PFD 711. The PFD 711 compares the frequency error and the phase error between the signals and generates a series of increment control signals UP and decrement control signals DN.

The charge pump 712 performs charge/discharge based upon the status of the increment control signals UP and the decrement control signals DN (in which a charge current is marked as $I_{up}$ and a discharge current is marked as $I_{dn}$; the charge pump 712 generates the charge current $I_{up}$ when UP is 0, and generates the discharge current $I_{dn}$ when DN is 1) and generates a control current $I_{cp}$ ($I_{up}+I_{dn}=I_{cp}$). The control current is transmitted to the filter 713 composed of a resistor 7131, a MIM capacitor 7132, and a MOS capacitor 7133. Those capacitors in the charge pump 712 are usually used as energy storage elements and capable of filtering out high-frequency signals of the decrement control signals DN and the increment control signals UP to produce a control voltage. It is inevitable that a leaking current I may occur due to low thickness of the gate oxide layer of the MOS capacitor 7133. And the leaking current flows out from the filter 713 (I flows downward).

For the issue of the existing current leakage in the MOS capacitor 7133, the present invention provides a current compensation circuit to compensate the current leakage. More details are described thereinafter. According to FIG. 7, the current compensation circuit comprises a MOS capacitor 72, which is a one-$M^{th}$-time capacitor (the M is a natural number), a first compensation circuit 73, a second compensation circuit 74, a comparator having two input nodes 75, a successive approximation register (SAR) 76, a switch 77 (the present embodiment adopts a MOS capacitor), and a second frequency divider 716.

Figure 7:
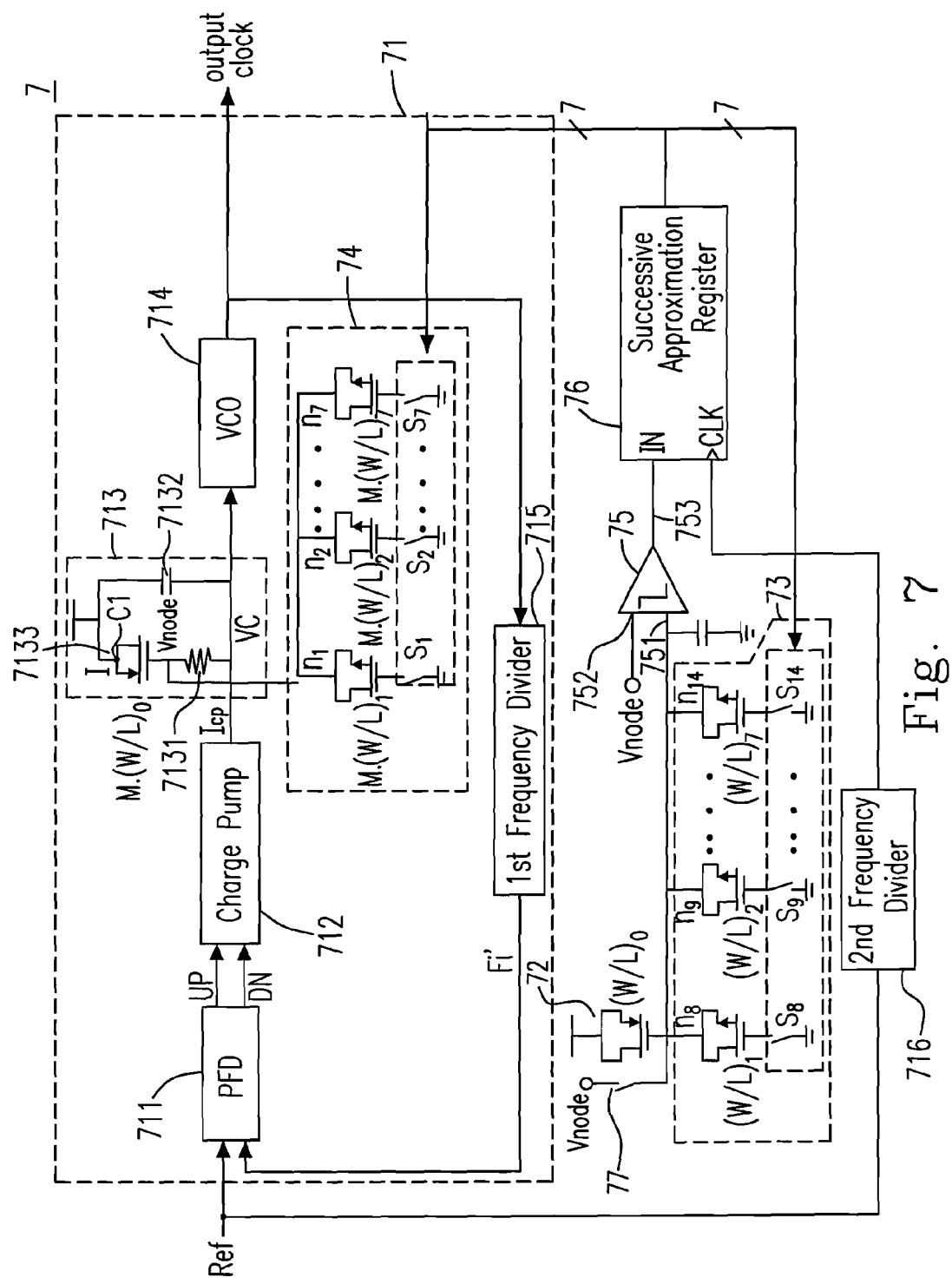
FIG. 7 is a circuit diagram showing a further preferred embodiment of the present invention.

According to FIG. 7, the first frequency divider 715 comprises a plurality of NMOS capacitors (using 7 NMOS for instance, a first NMOS capacitor $n_1$~a seventh NMOS capacitor $n_7$) and a third group of plurality of switches correspondingly connected to those NMOS capacitors (for instance, a first switch $S_1$~a seventh switch $S_7$). Those switches $S_1$~$S_7$ are used for receiving a first digital control signal from the SAR 76. The gate of the MOS capacitor 72 is connected to a first input node 751 of the comparator 75. The source and the drain of the MOS capacitor 72 are respectively connected to a high voltage node $V_{node}$. The first compensation circuit 73 comprises a plurality of NMOS capacitors (using 7 NMOS for instance, an eighth NMOS capacitor $n_8$~a fourteenth NMOS capacitor $n_{14}$, wherein the size of each of the NMOS capacitors in the first compensation circuit is one $M^{th}$ of that of each of the NMOS in the second compensation circuit 74) and a fourth group of plurality of switches (for instance, a eighth switch $S_8$~a fourteenth switch $S_{14}$) correspondingly connected to those NMOS capacitors. The first compensation circuit 73 is connected to the first input node 751 of the comparator. The fourth group of switches are used for receiving a second digital control signal from the SAR 76. A second input node 752 is connected to the compensation voltage node C1 in the filter. An output node of the comparator 75 is connected to an input node IN of the SAR 76. A second frequency divider 716 (a natural number N' is used as divisor) performs frequency dividing for the reference clock signal Ref and transmits the result to a clock node CLK at the SAR 76.

The drain of the MOS switch 77 is connected to C1. The source of the MOS switch 77 is connected to the first input node of the comparator 751. The gate of the MOS switch 77 receives an output signal, which is originated from the reference signal Ref frequency-reduced by the second frequency divider 716.

When the voltage at the first input node 751 is higher than that at the second input node 752, the output node 753 of the comparator 75 outputs a bit signal (say 1 in binary code). When the voltage at the first input node 751 is lower than that at the second input node 752, the output node 753 outputs a bit signal (say 0 in binary code).

When the MOS capacitor 7133 in the filter 713 generates a leaking current I, the MOS capacitor 72 automatically generates a one-$M^{th}$-time current $I_{1/M}$. In the meantime, all the switches of the fourth group in the first compensation circuit 73 are in an open status. The one-$M^{th}$-time current $I_{1/m}$ charges the first input node 751 of the comparator 75 to escalate its voltage value (the escalated voltage value is also indicated as a variable voltage). Now the voltage at the first input node 751 of the comparator 75 is higher than that at the compensation voltage node C1. The comparator 75 transmits a first bit signal (say 1 in binary code) to the SAR 76. Continually, the comparator 75 transmits a second bit signal (say 0 in binary code), a third bit signal, all the way to a seventh bit signal to the SAR 76 (totally seven bits, 1010101). Particularly, when the SAR 76 receives the first bit signal, it outputs a first digital control signal having seven bits (1000000) and a second digital control signal having seven bits (1000000) to the second compensation circuit 74 and the first compensation circuit 73 respectively. Now, the MOS switch 77 is turned on, according to the output signal (the status is "1") from the second frequency divider 716, which makes the compensation voltage node C1 in the filter 713 connected to the first input node 751 of the comparator 75; therefore, the voltage of the former is the same as that of the latter. When the second digital control signal (1000000) is input to the first compensation circuit 73, the MOS switch 77 is turned off according to the output signal (the status is 0) from the second frequency divider 716. In the mean time, the eighth NMOS capacitor $n_8$ in the first compensation circuit 73 is turned on, while the ninth NMOS capacitor $n_9$ all the way to the fourteenth NMOS capacitor $n_{14}$ are turned off.

If the leaking current of the eighth NMOS capacitor $n_8$ is larger than the one-$M^{th}$-time current $I_{1/m}$, a difference of the two will discharge the first input node 751 of the comparator 75 to reduce its voltage value. Then the comparator 75 transmits a bit signal (say 0 in binary code) to the SAR 76. The SAR 76 outputs a third digital control signal having seven bits (0100000) and a fourth digital control signal having seven bits (0100000) to the second compensation circuit 74 and the first compensation circuit 73 respectively.

If the leaking current of the eighth NMOS capacitor $n_8$ is less than the one-$M^{th}$-time current $I_{1/M}$, a difference of the two will charge the first input node 751 of the comparator 75 to escalate its voltage value. Then the comparator 75 transmits a bit signal (say 1 in binary code) to the SAR 76. The SAR 76 outputs a third digital control signal having seven bits (1100000) and a fourth digital control signal having seven bits (1100000) to the second compensation circuit 74 and the first compensation circuit 73 respectively.

Continually, the SAR 76 outputs a thirteenth digital control signal having seven bits and a fourteenth digital control signal having seven bits to the second compensation circuit 74 and the first compensation circuit 73 respectively, based upon a difference of the current leakages between the one-$M^{th}$-time current $I_{1/M}$ and the NMOS capacitors $n_8$~$n_{14}$. Finally, the thirteenth and the fourteenth digital control signals are a set of the best codes for the second compensation circuit 74 and the first compensation circuit 73.

According to the above, for the difference between the leakage at the NMOS capacitors $n_1$~$n_7$ and the leakage I at C1 and that between the leakage at the NMOS capacitors $n_8$~$n_{14}$ and the one-$M^{th}$-time current $I_{1/M}$ are both positive or negative, during the process when the first compensation circuit 73 performs current compensation to the MOS capacitor 72, the second compensation circuit 74 performs current compensation to the compensation voltage node C1.

During the process when the compensation circuit performs current compensation to C1, the control voltage VC generated by the filter 713 is transmitted to the VCO 714. And the VCO 714 generates a high-frequency clock signal based upon the variation of the control voltage VC.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims that are to be accorded with the broadest interpretation so as to encompass all such modifications and similar structures.

What is claimed is:

1. A phase locked loop with a current leakage adjustment function, comprising:
    a phase locked loop unit having a filter, and generating a control voltage based upon a frequency error and a phase error between a reference clock signal and a feedback signal, wherein the filter has a compensation voltage node and a first leakage current having a first value; and
    a self-adjusting circuit including:
    a MOS capacitor generating a second leakage current having a second value being one $M^{th}$ of the first value of the first leakage current based upon the first leakage current, wherein M is a natural number;
a current mirror generating a compensation current having a magnitude near M times of the first value of the first leakage current based upon the second leakage current, inputting the compensation current into the compensation voltage node of the filter, and receiving the second leakage current to generate a reference voltage; and
    a voltage adjusting circuit performing a variety of band switchings when a voltage value at the compensation voltage node is not equal to that of the reference voltage in the current mirror.

2. A phase locked loop as claimed in claim 1, wherein the phase locked loop unit generates a high frequency clock signal based upon a variation of the control voltage.

3. A phase locked loop as claimed in claim 1, wherein the voltage adjusting circuit comprises a comparator and a successive approximation register.

4. A phase locked loop as claimed in claim 1, wherein the current mirror comprises a first NMOS transistor, a second NMOS transistor and a conducting line.

5. A phase locked loop as claimed in claim 4, wherein a size of the second NMOS transistor is M times of that of the first NMOS transistor.

6. A phase locked loop as claimed in claim 4, wherein the conducting line is connected to a gate and a source of the first NMOS transistor and a gate of the second NMOS transistor respectively.

7. A phase locked loop as claimed in claim 4, wherein the reference voltage occurs when the second leakage current flows into the first NMOS transistor via the conducting line.

8. A phase locked loop with a current leakage adjustment function, comprising:
    a phase locked loop unit having a first compensation circuit and a filter, and generating a control voltage based upon a frequency error and a phase error between a reference clock signal and a feedback signal, wherein the first compensation circuit provides a first compensation current having a first value, and the filter has a compensation voltage node and a first leakage current having a second value;
    a MOS capacitor generating a second leakage current having a third value being one $M^{th}$ of the second value of the first leakage current based upon the first leakage current, wherein M is a natural number;
    a second compensation circuit connected to the compensation voltage node via a switch and generating a second compensation current having a fourth value being one $M^{th}$ of the first value of the first compensation current; and
    a code selector respectively receiving a first voltage at a point between the MOS capacitor and the second compensation circuit and a second voltage from the compensation voltage node of the filter, and inputting a set of best codes to the first and the second compensation circuits respectively.

9. A phase locked loop as claimed in claim 8, wherein the switch is a MOS transistor switch, and the phase locked loop unit generates a high frequency clock signal based upon a variation of the control voltage.

10. A phase locked loop as claimed in claim 8, wherein the code selector comprises:
    a comparator receiving the first voltage and the second voltage, comparing the first voltage with the second voltage, and outputting a digital control signal; and
    a successive approximation register identifying the set of best codes based upon a number of a plurality of bits of the digital control signal, and transmitting the set of best codes to the first and the second compensation circuits.

11. A phase locked loop as claimed in claim 8, wherein both the first and the second compensation circuits comprise a plurality of NMOS capacitors and a plurality of switches correspondingly connected to the plurality of NMOS capacitors.

12. A phase locked loop as claimed in claim 11, wherein a size of the NMOS capacitors in the second compensation circuit is one $M^{th}$ of that of the NMOS capacitors in the first compensation circuit.

13. A phase locked loop as claimed in claim 8, wherein the phase locked loop unit further comprises:
    a phase-frequency detector receiving the reference clock signal and the feedback signal for comparison, and generating a series of increment control signals and a series of decrement control signals based upon the frequency error as well as the phase error between the reference clock signal and the feedback signal;
    a charge pump receiving the increment control signals and the decrement control signals from the phase-frequency detector for charging/discharging to generate a control current;
    a voltage-controlled oscillator generating a high frequency clock signal based upon a variation of the control voltage from the filter; and
    a first frequency divider receiving the high frequency clock signal from the voltage-controlled oscillator and performing a frequency divission for generating the feedback signal.

14. A phase locked loop, comprising:
    a phase locked loop unit having a compensation voltage node, and generating a control voltage based upon a phase error between a reference clock signal and a feedback signal;
    a digitalized leakage-detection circuit generating a plurality of digital control signals based upon the phase error between the reference clock signal and the feedback signal, and including a lock detector, a logic controller, a frequency divider and a counter; and a compensation circuit generating a compensation current based upon the plurality of digital control signals.

15. A phase locked loop as claimed in claim 14, wherein the phase locked loop unit further comprises:

a phase-frequency detector receiving the reference clock signal and the feedback signal, and generating a series of increment control signals and a series of decrement control signals based upon a frequency error and the phase error between the reference clock signal and the feedback signal;

a charge pump receiving the increment control signals and the decrement control signals from the phase-frequency detector for charging/discharging to generate a control current;

a filter having the compensation voltage node, receiving the control current from the charge pump, filtering high frequency signals of the increment control signals and the decrement control signals, and generating the control voltage;

a voltage-controlled oscillator generating a high frequency clock signal based upon a variation of the control voltage from the filter; and a frequency divider receiving the high frequency clock signal from the voltage-controlled oscillator and performing a frequency division for generating the feedback signal.

16. A phase locked loop as claimed in claim 15, wherein the filter comprises a resister, a MIN capacitor, and a MOS capacitor.

17. A phase locked loop as claimed in claim 16, wherein the MOS capacitor has a leakage current charging the filter so as to change a value of the control voltage.

18. A phase locked loop as claimed in claim 15, wherein the compensation circuit generates the compensation current based upon codes of the digital control signals from the digitalized leakage detection circuit, and the compensation current is inputted into the compensation voltage node of the filter.

19. A phase locked loop as claimed in claim 14, wherein the compensation circuit comprises:

a plurality of first switches, each of which includes a pair of first NMOS capacitors; and a plurality of second switches, each of which includes a current source connected to a second NMOS capacitor, wherein all the first switches are connected to one another, and all the second switches are connected to one another.

* * * * *